US009134153B2

(12) United States Patent
Matsumoto et al.

(10) Patent No.: US 9,134,153 B2
(45) Date of Patent: Sep. 15, 2015

(54) FLOWMETER

(75) Inventors: Masahiro Matsumoto, Tokyo (JP); Hiroshi Nakano, Tokyo (JP); Keiji Hanzawa, Hitachinaka (JP); Satoshi Asano, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/131,125

(22) PCT Filed: Jul. 13, 2011

(86) PCT No.: PCT/JP2011/003993

§ 371 (c)(1), (2), (4) Date: Jan. 6, 2014

(87) PCT Pub. No.: WO2013/008273

PCT Pub. Date: Jan. 17, 2013

(65) Prior Publication Data

US 2014/0159174 A1 Jun. 12, 2014

(51) Int. Cl.

*G01F 1/34* (2006.01)
*G01F 1/692* (2006.01)
*G01F 1/684* (2006.01)

(52) U.S. Cl.

CPC ................ *G01F 1/34* (2013.01); *G01F 1/6845* (2013.01); *G01F 1/692* (2013.01)

(58) Field of Classification Search

CPC .......................................................... G01F 1/34
USPC .......................................................... 257/415
See application file for complete search history.

(56) References Cited

U.S. PATENT DOCUMENTS 4,680,963 A * 7/1987 Tabata et al. ............... 73/204.18
5,061,350 A * 10/1991 Ishiguro et al. ............... 205/118
6,988,399 B1 * 1/2006 Watanabe et al. .......... 73/204.26
2005/0250239 A1 * 11/2005 Kawai ............................ 438/54
2007/0113648 A1 * 5/2007 Arisaka ...................... 73/335.04
2008/0148842 A1 * 6/2008 Oda .......................... 73/204.26
2008/0309734 A1 * 12/2008 Nishimura et al. ............ 347/70
2009/0000396 A1 * 1/2009 Kawanishi et al. ........ 73/861.95

FOREIGN PATENT DOCUMENTS

JP 2001-50787 * 2/2001
JP 2001-050787 A 2/2001
JP 2004-294207 * 10/2004

(Continued)

OTHER PUBLICATIONS

PCT International Search Report on application PCT/JP2011/003993 mailed Aug. 16, 2011; 2 pages.

*Primary Examiner* — Jarrett Stark
*Assistant Examiner* — Mohammad M Hoque
(74) *Attorney, Agent, or Firm* — Foley & Lardner LLP

(57) ABSTRACT

A flowmeter that improves a corrosion resistance is provided. The flowmeter includes a silicon substrate having a diaphragm where a heater is formed, an aluminum pad formed on a silicon substrate, an organic protective film laminated on the silicon substrate, and a mold resin that covers the silicon substrate. The diaphragm has an exposed portion exposed from the organic protective film, an adhesion surface high in adhesion property to the mold resin is laminated on the silicon substrate, and an adhesion film of the mold resin to the adhesion film is provided between the exposed portion and the aluminum pad.

10 Claims, 7 Drawing Sheets

1 19 2 20 8 9 10 16 11 12 6 5 4 3 13 14 15

(56) References Cited

FOREIGN PATENT DOCUMENTS

| | | | |
|---|---|---|---|
| JP | 2004-294207 A | | 10/2004 |
| JP | 2008-157742 A | | 7/2008 |
| JP | 2009-71076 | * | 2/2009 |
| JP | 2009-071076 A | | 4/2009 |

* cited by examiner

FLOWMETER

TECHNICAL FIELD

The present invention relates to a flowmeter, and a flowmeter that measures an intake air of an internal combustion engine.

BACKGROUND ART

As a conventional example of the flowmeter, there is a semiconductor device disclosed in, for example, Patent Literature 1. The semiconductor device of Patent Literature 1 employs a configuration in which a part of a silicon substrate configuring a flow rate detection unit is sealed with a sealing resin.

CITATION LIST

Patent Literature

Patent Literature 1: Japanese Unexamined Patent Application Publication No. 2008-157742

SUMMARY OF INVENTION

Technical Problem

However, Patent Literature 1 has a structure in which a polyimide resin which is an organic protective film is exposed to an external of a sealing resin, and no consideration ±s given to the permeability of moisture into the polyimide resin and the adhesion strength of the polyimide resin and an epoxy resin.

The polyimide resin is high in the permeability of moisture as compared with an inorganic because the polyimide resin is made of an organic polymer material although its molecular structure has a mesh structure. Also, the adhesion strength of the polyimide resin and the epoxy resin is low compared with the strength of an oxide film and the epoxy resin, and an adhesion surface is liable to be peeled off. If they cause the penetration of moisture, an aluminum wire or an aluminum pad may be corroded. For that reason, it is difficult to configure a corrosion-prone fine aluminum wire on a silicon substrate, and ±t ±s difficult to configure an electronic circuit requiring a complicated and tine aluminum wire on the silicon substrate.

An object of the present invention is to provide a flowmeter that improves a corrosion resistance.

Solution to Problem

In order to solve the above problem, there is provided a flowmeter including a silicon substrate having a diaphragm where a heater is formed, an aluminum pad formed on a silicon substrate, an organic protective film laminated on the silicon substrate, and a mold resin that covers the silicon substrate, in which the diaphragm has an exposed portion exposed from the organic protective film, an adhesion surface high in adhesion property to the mold resin is laminated on the silicon substrate, and an adhesion film of the mold resin to the adhesion film is provided between the exposed portion and the aluminum pad.

Advantageous Effects of Invention

According to the present invention, there can be provided a flowmeter that improves the corrosion resistance.

DESCRIPTION OF EMBODIMENTS

Hereinafter, embodiments of the present invention will be described with reference to FIGS. 1 to 11.

First, a flowmeter according to a first embodiment of the present invention will be described with reference to FIGS. 1 to 4.

Figure 1:
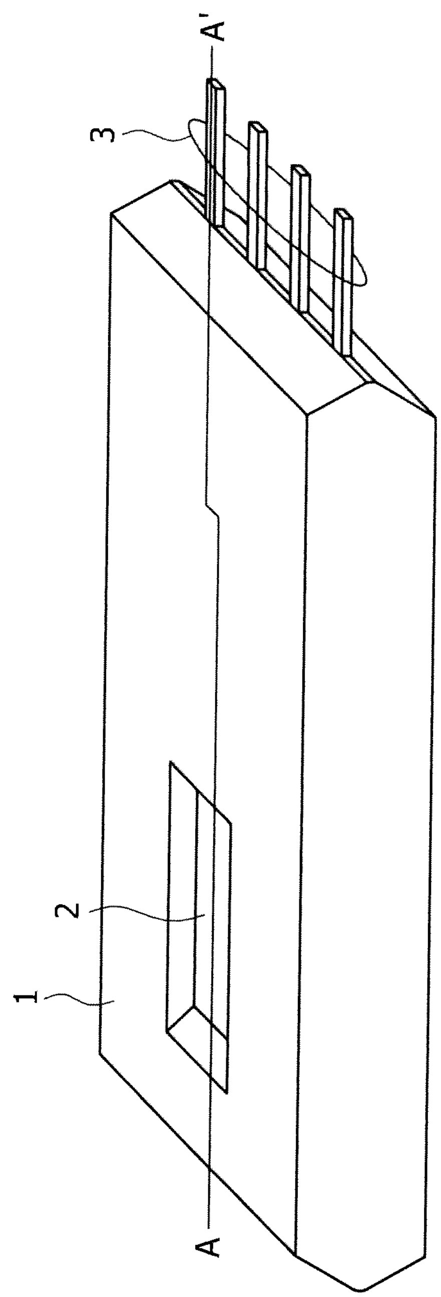
FIG. 1 is an outline view of a flowmeter according to a first embodiment.
Figure 2:
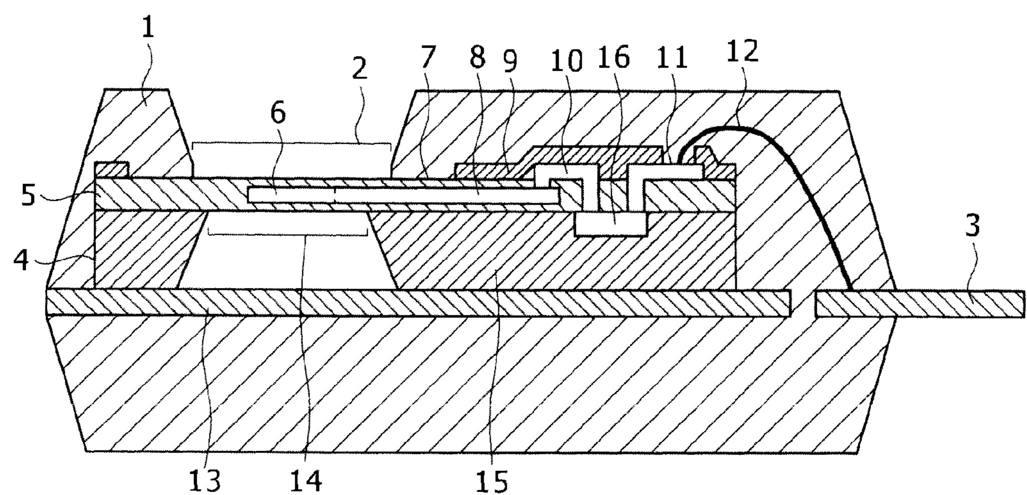
FIG. 2 is a cross-sectional view taken along a line A-A' in FIG. 1.

The flowmeter according to the first embodiment is of a structure in which a flow rate detection element 4 is arranged on a lead frame 13, and molded with a mold resin 1, as illustrated in FIGS. 1 and 2. A part of the flow rate detection element 4 is exposed to an external of the mold resin 1 from an exposed portion 2 so that a measurement airflow is applied directly to the flow rate detection element 4. Also, a part of the lead frame 13 configures an external terminal 3, and connects a power terminal and an output terminal of the flow rate detection element 4 to the external terminal 3 through an aluminum pad 11 and a gold wire 12 to extract an electric signal to the external of the mold resin 1.

Subsequently, the flow rate detection element 4 w±11 be described. In the flow rate detection element 4, an inorganic insulating film 5 is laminated on a silicon substrate 15, and a hollow portion is formed in a part of the silicon substrate 15, and a diaphragm 14 having a thin film structure is disposed therein. A heater 6 formed of a thin film made of polysilicon, platinum, molybdenum, or tungsten is disposed on the diaphragm 14, the heater 6 is heated, and a radiation amount of the heater 6 or a change in temperature around the heater 6 is measured to measure an air flow rate. Also, the heater 6 is connected to an electronic circuit 16 from wires 8 and 17 made of the same material through aluminum wires 10 and 18, and a heat control or a temperature detection of the heater 6 is conducted by the electronic circuit 16. Also, the electronic circuit 16 is connected to the aluminum pad 11, and a power supply and an output signal are extracted to the external through the gold wire 12 and the external terminal 3. Also, an organic protective film 9 is arranged for the protection of the aluminum wires 10 and 18. The aluminum wires 10, 18, and the aluminum pad 11 are formed by patterning an aluminum film. Also, the organic protective film 9 is suitably made of a polyimide resin or a polybenzoxazole resin. A polyimide film made of the polyimide resin is low in transmittance of moisture as the organic resin, and can prevent the penetration of moisture. An organic film made of the polybenzoxazole resin is 114 to 113 of the polyimide resin in water absorption ratio, twice as large as the polyimide film made of the polyimide resin ±n adhesion strength to the mold resin 1, suitable as the protective film, and can further suppress the penetration of moisture.

Figure 3:
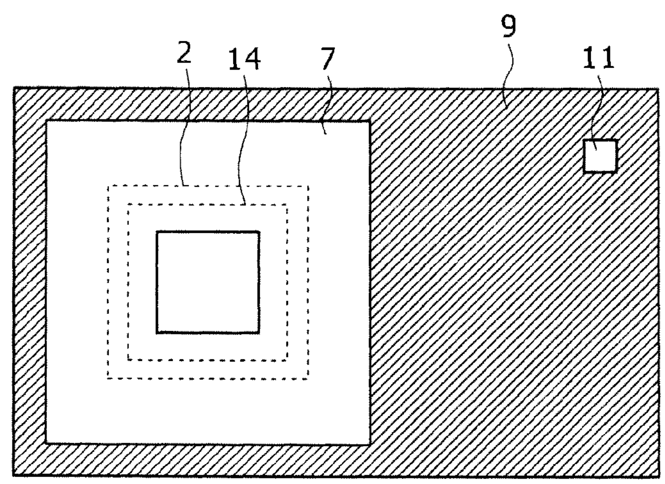
FIG. 3 is a diagram illustrating a planar shape of an organic protective film laminated on a surface of a flow rate detection element.

Also, a removal portion 7 is disposed in the organic protective film 9 as illustrated in FIG. 3, and an adhesion surface of the mold resin 1 and the inorganic insulating film 5 is disposed between the exposed portion 2 and the aluminum wires 10 and 18. Even if the inorganic insulating film 5 is formed of a silicon oxide film, a silicon nitride film, or aluminum oxide, the moisture hardly penetrates into the inorganic insulating film 5, the penetration of moisture can be prevented. A precise film that has been subjected to a heat treatment at at least 800° C. can more suppress the penetration of moisture.

Also, in order to allow the inorganic insulating film 5 to function as the adhesion film to the mold resin 1, it is preferable that the adhesion property to the mold resin 1 is higher. For that reason, since the oxide film is higher ±n the adhesion property to the mold resin 1 than the nitride film, it is suitable that the inorganic insulating film 5 is formed of an oxide film such as the silicon oxide film or the aluminum oxide.

The manufacture of the inorganic insulating film 5 is easier if the inorganic insulating film 5 is formed of a silicon oxide film.

If the adhesion property to the mold resin 1 is enhanced, the peeling of the mold resin 1 can be prevented, and the penetration of moisture from a peeled portion can be prevented.

Figure 4:
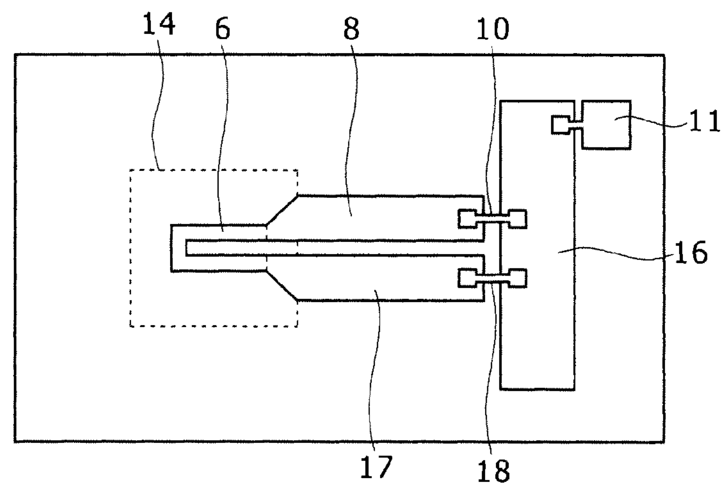
FIG. 4 is a plan view illustrating wires of a flow rate detection element.

Also, as illustrated in FIG. 4, in the flowmeter according to this embodiment, the heater 6 is arranged on the diaphragm 14, and electrically connected to the electronic circuit 16 through the wide wires 8 and 17 made of the same material as that of the heater 6 via the aluminum wires 10 and 18. In this situation, the wires 8 and 17 formed within the inorganic insulating film 5 of the removal portion 7 (adhesion surface of the mold resin 1 and the inorganic insulating film 5) are made of the same material as that of the heater 6. With the above configuration, the use of the aluminum wiring liable to be corroded by moisture is avoided. Also, the wires 8 and 17 whose peripheries are protected with the inorganic insulating film 5 are protected from moisture with the inorganic insulating film 5. As a result, since the wires 8 and 17 are remarkably resistant to the corrosion caused by moisture, the reliability can be improved.

Figure 5:
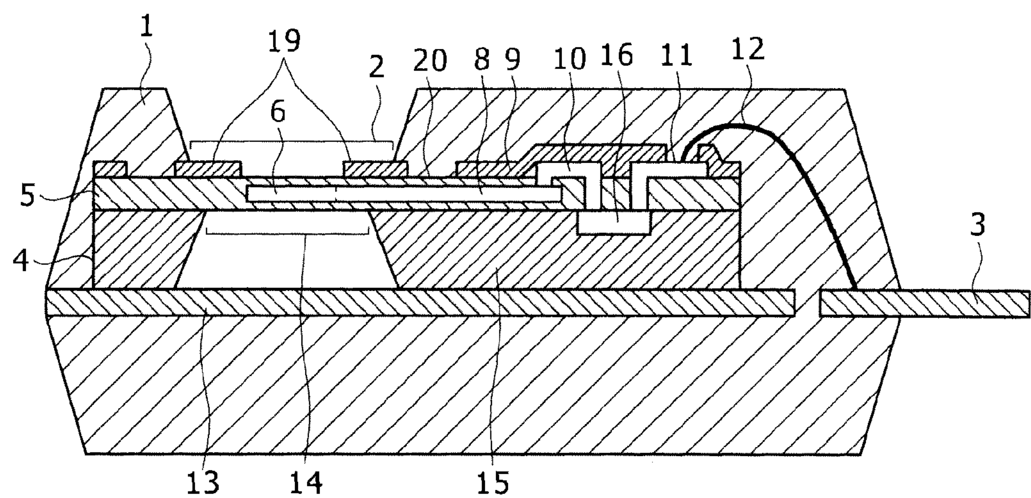
FIG. 5 is a cross-sectional view taken along the line A-A' of the flowmeter in FIG. 1 according to a second embodiment.
Figure 6:
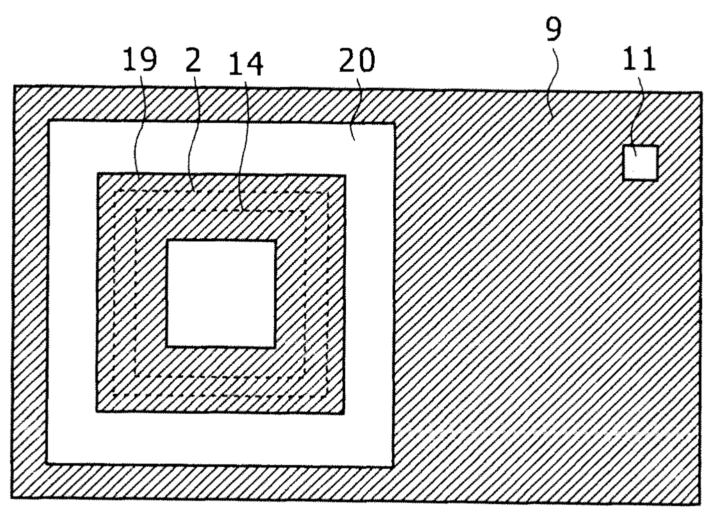
FIG. 6 is a diagram illustrating a planar shape of an organic protective film laminated on a surface of a flow rate detection element according to the second embodiment.

Subsequently, a flowmeter according to a second embodiment according to the present invention will be described with reference to FIGS. 5 and 6.

In the flowmeter according to the second embodiment, the flowmeter according to the first embodiment is improved as follows. In this embodiment, a slit 20 is formed as the removal portion, and an organic protective film 19 is newly provided. The organic protective film 19 is arranged to surround an end of the diaphragm 14, and an end of the organic protective film 19 is fixed to the mold resin 1. The end of the diaphragm 14 represents an area surrounded by two broken lines indicated in FIG. 6. However, the organic protective film 19 may be arranged to surround an inner broken line of at least two broken lines.

With the provision of the slit 20 as described above, the adhesion surface of the mold resin 1 and the inorganic insulating film 5 can be provided between the organic protective film 9 and the organic protective film 19, and the penetration of moisture from the adhesion surface of the mold resin 1 and the organic protective film 9 can be prevented. As a result, because the aluminum pad 11 is protected from moisture with the inorganic insulating film 5, the corrosion resistance can be improved with an improvement in the reliability.

Also, when the organic protective film 19 is arranged to surround the end of the diaphragm 14, a strength of the diaphragm 14 can be improved. That is, when a weight or an impact force is applied to the diaphragm 14, a location where a highest stress is applied becomes the end of the diaphragm 14. However, the strength of the end is reinforced by the organic protective film 19 with the results that the concentration of the stress can be dispersed. For that reason, a possibility that the diaphragm 14 is cracked by exerting an excessive stress on the diaphragm 14 can be prevented. As a result, the penetration of moisture can be prevented from a cracked portion generated in the diaphragm 14, and the corrosion resistance is further improved as compared with the first embodiment.

Also, since there arises a problem that the organic protective film 19 is low in the adhesion strength to the inorganic insulating film 5, and liable to be peeled off, a peripheral portion of the organic protective film 19 is fixed by the mold resin 1 in this embodiment. With the above configuration, the end of the organic protective film 19 can be fixed by the mold resin 1, and the peeling of the organic protective film 19 can be prevented. Then, the organic protective film 19 is arranged to cover the end of the diaphragm 14 so that a change in the diaphragm end can be suppressed. As a result, a gap generated in the adhesion surface between the mold resin 1 and the organic protective film 19 can be reduced, and the moisture penetrated from the adhesion surfaces can be reduced to improve the corrosion resistance.

Subsequently, a flowmeter according to a third embodiment of the present invention will be described with reference to FIGS. 7 to 11.

Figure 7:
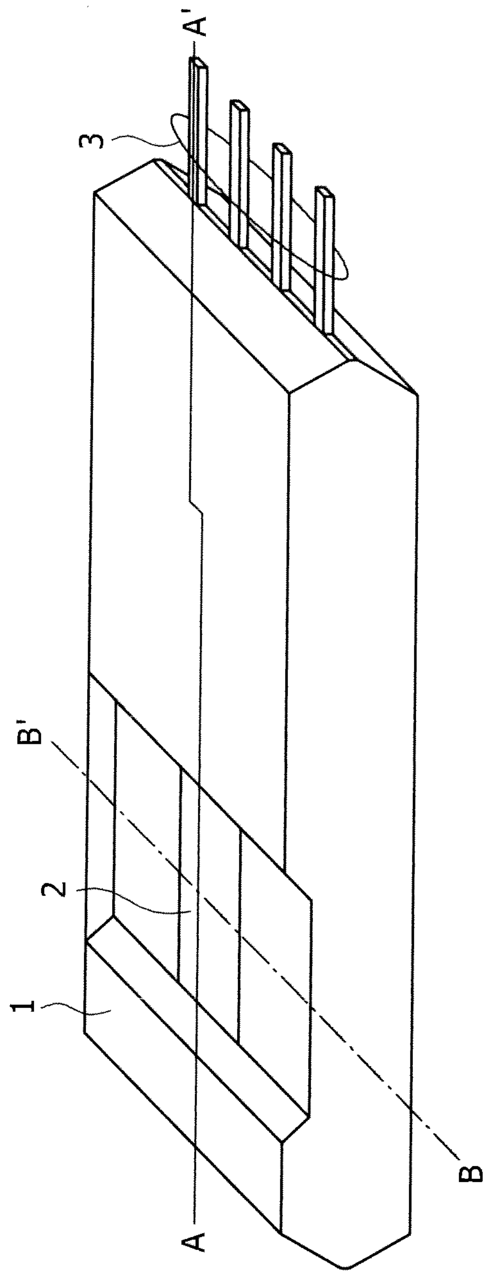
FIG. 7 is an outline view of a flowmeter according to a third embodiment.
Figure 8:
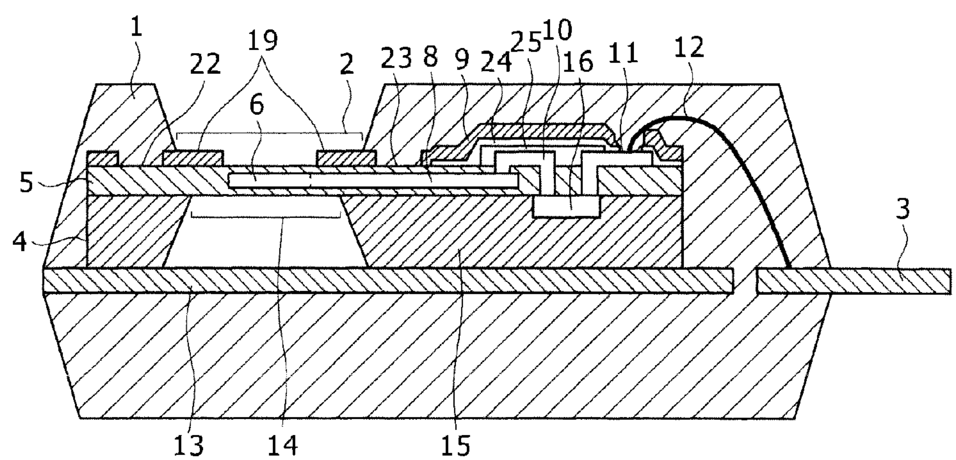
FIG. 8 is a cross-sectional view taken along a line A-A' in FIG. 7.
Figure 9:
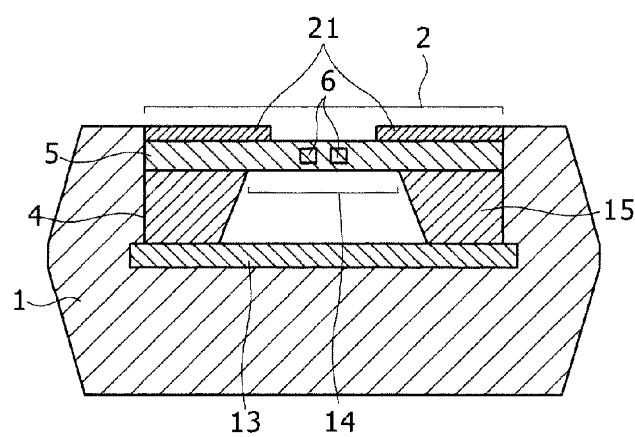
FIG. 9 is a cross-sectional view taken along a line B-B' in FIG. 7.
Figure 10:
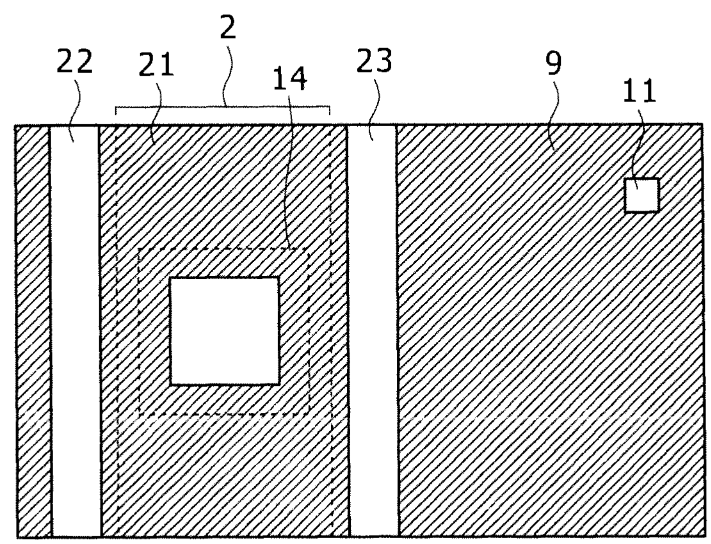
FIG. 10 is a diagram illustrating a planar shape of an organic protective film laminated on a surface of a flow rate detection element according to a third embodiment.
Figure 11:
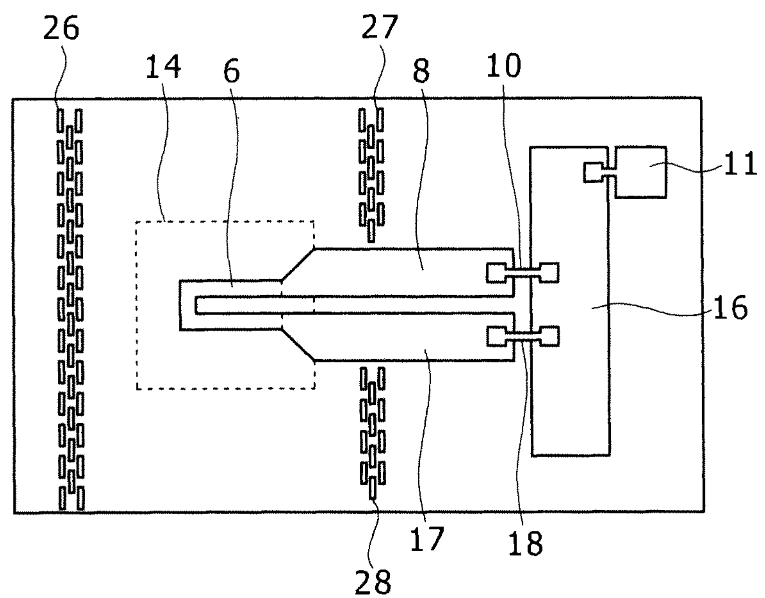
FIG. 11 is a plan view illustrating wires of a flow rate detection element.

The flowmeter according to the third embodiment has the substantially same structure as that of the flowmeter in the first embodiment, but is improved as follows. In this embodiment, as illustrated in FIGS. 7 and 9, the flow rate detection element 4 is exposed to the external from end to end in a direction of B-B' to configure the exposed portion 2, and a height of the exposed portion 2 is set to be substantially identical with a height of the mold resin 1. As a result, the measurement air flow smoothly flows in a direction of B-B'. In this case, as illustrated in FIGS. 9 and 10, an organic protective film 21 is extended from an edge of the diaphragm 14 to an end of the flow rate detection element 4 to increase an adhesion area of the organic protective film 21, and prevents the organic protective film 21 from being peeled off. In a direction of A-A', as in the first embodiment, the end of the organic protective film 21 is fixed by the mold resin 1 to prevent the organic protective film 21 from being peeled off.

Also, in this embodiment, a phosphorus glass film 25 such as a PSG (phospho-silicate-glass) film or a BPSG (boron phosphorus silicon glass) film is laminated on the aluminum pad 11, a silicon nitride film 24 is arranged to cover the phosphorus glass film 25, and the organic protective film 9 is further arranged thereon. With the above configuration, even if the aluminum wire 10 is formed into a line pattern, the aluminum wire 10 can be prevented from being corroded by moisture penetrated through the mold resin 1.

The phosphorus glass film 25 is covered with the silicon nitride film 24, thereby being capable of preventing phosphorous ions from being leaked from the phosphorus glass film 25 to corrode the aluminum pad 11 by the phosphorous ions.

Also, in this embodiment, the phosphorus glass film 25 and the silicon nitride film 24 are removed at positions of slits 22 and 23. As a result, the adhesion surface of the inorganic insulating film 5 and the mold resin 1 can be configured, and the inorganic insulating film 5 can be further formed of a silicon oxide film higher in the adhesion property to the mold resin. Therefore, the penetration of moisture can be prevented.

Also, in this embodiment, irregular patterns 26, 27, and 28 made of the same material as that of the heater 6 are formed at locations of the slits 22 and 23. With the above configuration, since irregularity can be formed on a surface of the inorganic insulating film 5, a surface area where the inorganic insulating film 5 and the mold resin 1 adhere to each other is increased. The adhesion property of the inorganic insulating film 5 and the mold resin 1 can be more enhanced, and the penetration of moisture can be prevented.

LIST OF REFERENCE SIGNS

1 mold resin
2 exposed portion
3 external terminal
4 flow rate detection element
5 inorganic insulating film
6 heater
7 removal portion
8 and 17 wire
9, 19, 21 organic protective film
10, 18 aluminum wire
11 aluminum pad
12 gold wire
13 lead frame
14 diaphragm
15 silicon substrate
16 electronic circuit
20, 22, 23 slit
24 silicon nitride film
25 phosphorus glass film
26, 27, 28 irregular pattern

The invention claimed is:

1. A flowmeter comprising:
- a silicon substrate having a diaphragm where a heater is disposed;
- an aluminum film including an aluminum pad or an aluminum wire disposed on the silicon substrate;
- an organic protective film laminated on the silicon substrate; and
- a mold resin that covers the silicon substrate,
- wherein the diaphragm has an exposed portion exposed from the organic protective film,
- wherein an adhesion film having a high adhesion property to the mold resin is laminated on the silicon substrate,
- wherein an adhesion surface of the mold resin adhering to the adhesion film is provided between the exposed portion and the aluminum pad, and
- wherein the organic protective film comprises:
  - a first organic protective film disposed to surround the diaphragm; and
  - a second organic protective film disposed to surround an edge of the diaphragm.

2. The flowmeter according to claim 1, wherein the adhesion film comprises an inorganic insulating film.

3. The flowmeter according to claim 1, wherein the adhesion surface of the mold resin adhering to the inorganic insulating film is provided between the first organic protective film and the second organic protective film.

4. The flowmeter according to claim 1, wherein the organic protective film comprises a polyimide film.

5. The flowmeter according to claim 1, wherein the organic protective film is made of polybenzoxazole resin.

6. The flowmeter according to claim 1,
- wherein a silicon nitride film is disposed on an upper portion of the aluminum film.

7. The flowmeter according to claim 1, wherein the adhesion film is an adhesion film that is heat-treated at at least 800° C.

8. The flowmeter according to claim 1, wherein the adhesion surface has an irregular pattern.

9. The flowmeter according to claim 1, wherein a wire intersecting with the adhesion surface is made of the same material as a material of the heater.

10. A flowmeter, comprising:
- a silicon substrate having a diaphragm where a heater is disposed;
- an aluminum film including an aluminum pad or an aluminum wire disposed on the silicon substrate;
- an organic protective film laminated on the silicon substrate; and
- a mold resin that covers the silicon substrate,
- wherein the diaphragm has an exposed portion exposed from the organic protective film,
- wherein an adhesion film having a high adhesion property to the mold resin is laminated on the silicon substrate,
- wherein an adhesion surface of the mold resin adhering to the adhesion film is provided between the exposed portion and the aluminum pad,
- wherein the organic protective film covers an edge of the diaphragm, and
- wherein the mold resin is disposed at an edge of the organic protective film that covers the edge of the diaphragm.

* * * * *